(12) United States Patent
Lin et al.

(10) Patent No.: US 11,908,764 B2
(45) Date of Patent: Feb. 20, 2024

(54) SEMICONDUCTOR PACKAGE INCLUDING A CIRCUIT SUBSTRATE HAVING A CAVITY AND A FLOOR PLATE EMBEDDED IN A DIELECTRIC MATERIAL AND A SEMICONDUCTOR DIE DISPOSED IN THE CAVITY

(71) Applicant: Taiwan Semiconductor Manufacturing Company, Ltd., Hsinchu (TW)

(72) Inventors: Meng-Liang Lin, Hsinchu (TW); Po-Yao Chuang, Hsin-Chu (TW); Te-Chi Wong, Hsinchu (TW); Shuo-Mao Chen, New Taipei (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 17/462,000

(22) Filed: Aug. 31, 2021

(65) Prior Publication Data
US 2023/0067914 A1    Mar. 2, 2023

(51) Int. Cl.
*H01L 23/31* (2006.01)
*H01L 21/56* (2006.01)
*H01L 25/065* (2023.01)
*H01L 23/00* (2006.01)
*H01L 25/00* (2006.01)
*H01L 23/48* (2006.01)

(52) U.S. Cl.
CPC ........ *H01L 23/3192* (2013.01); *H01L 21/561* (2013.01); *H01L 21/563* (2013.01);
(Continued)

(58) Field of Classification Search
CPC ....... H01L 21/563; H01L 24/16; H01L 24/32; H01L 24/81; H01L 24/83;
(Continued)

(56) References Cited

U.S. PATENT DOCUMENTS 6,982,491 B1 * 1/2006 Fan ................. B81B 7/0077
257/784
7,528,482 B2 * 5/2009 Huang ................. H01L 24/24
257/730
(Continued)

*Primary Examiner* — Khiem D Nguyen
(74) *Attorney, Agent, or Firm* — JCIPRNET

(57) ABSTRACT

A semiconductor package and a manufacturing method thereof are provided. The semiconductor package includes at least a circuit substrate, a semiconductor die and a filling material. The circuit substrate has a first surface, a second surface opposite to the first surface and a cavity concave from the first surface. The circuit substrate includes a dielectric material and a metal floor plate embedded in the dielectric material and located below the cavity. A location of the metal floor plate corresponds to a location of the cavity. The metal floor plate is electrically floating and isolated by the dielectric material. The semiconductor die is disposed in the cavity and electrically connected with the circuit substrate. The filling material is disposed between the semiconductor die and the circuit substrate. The filling material fills the cavity and encapsulates the semiconductor die to attach the semiconductor die and the circuit substrate.

20 Claims, 18 Drawing Sheets

(52) U.S. Cl.
CPC ............ H01L 23/481 (2013.01); H01L 24/16 (2013.01); H01L 24/32 (2013.01); H01L 24/73 (2013.01); H01L 24/81 (2013.01); H01L 24/83 (2013.01); H01L 24/96 (2013.01); H01L 25/0652 (2013.01); H01L 25/50 (2013.01); *H01L 2224/16227* (2013.01); *H01L 2224/32225* (2013.01); *H01L 2224/73204* (2013.01); *H01L 2924/181* (2013.01)

(58) Field of Classification Search
CPC . H01L 2221/68345; H01L 2221/68359; H01L 25/0652; H01L 2924/15311; H01L 2224/73204; H01L 2224/16225; H01L 2224/32225; H01L 2924/00012; H01L 23/13; H01L 23/5383; H01L 23/3192; H01L 23/481; H01L 25/50; H01L 24/73; H01L 24/92; H01L 24/96; H01L 224/32225
USPC ........................................................ 257/678
See application file for complete search history.

(56) References Cited

U.S. PATENT DOCUMENTS

| | | | |
|---|---|---|---|
| 8,367,477 B2 * | 2/2013 | Chien | ...................... H01L 24/24 257/E21.509 |
| 8,487,426 B2 * | 7/2013 | Essig | .................... H01L 23/295 257/730 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,832,985 B2 * | 11/2020 | Chiang | ................. H01L 23/3171 |
| 10,861,823 B2 * | 12/2020 | Pan | ......................... H01L 24/82 |
| 2009/0039527 A1 * | 2/2009 | Chan | ................. H01L 27/14625 257/E23.141 |
| 2011/0291288 A1 * | 12/2011 | Wu | ......................... H01L 24/81 257/773 |
| 2011/0316140 A1 * | 12/2011 | Nalla | .................. H01L 25/0655 257/E23.169 |
| 2012/0129299 A1 * | 5/2012 | Lin | ...................... H01L 23/5389 438/118 |
| 2012/0228754 A1 * | 9/2012 | Liu | ......................... A61P 19/00 257/676 |
| 2016/0181218 A1 * | 6/2016 | Karhade | ................. H01L 25/18 257/737 |
| 2018/0026008 A1 * | 1/2018 | Jeng | ..................... H01L 23/5389 257/692 |
| 2020/0006307 A1 * | 1/2020 | Tsai | ..................... H01L 23/3114 |
| 2020/0126942 A1 * | 4/2020 | Lee | ..................... H01L 21/4857 |
| 2020/0395308 A1 * | 12/2020 | Wu | ..................... H01L 21/4853 |

* cited by examiner

SEMICONDUCTOR PACKAGE INCLUDING A CIRCUIT SUBSTRATE HAVING A CAVITY AND A FLOOR PLATE EMBEDDED IN A DIELECTRIC MATERIAL AND A SEMICONDUCTOR DIE DISPOSED IN THE CAVITY

BACKGROUND

Semiconductor dies may be processed and packaged with other semiconductor devices or dies, and the sizes and dimensions of the packages are established through the arrangement of the semiconductor dies and/or devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
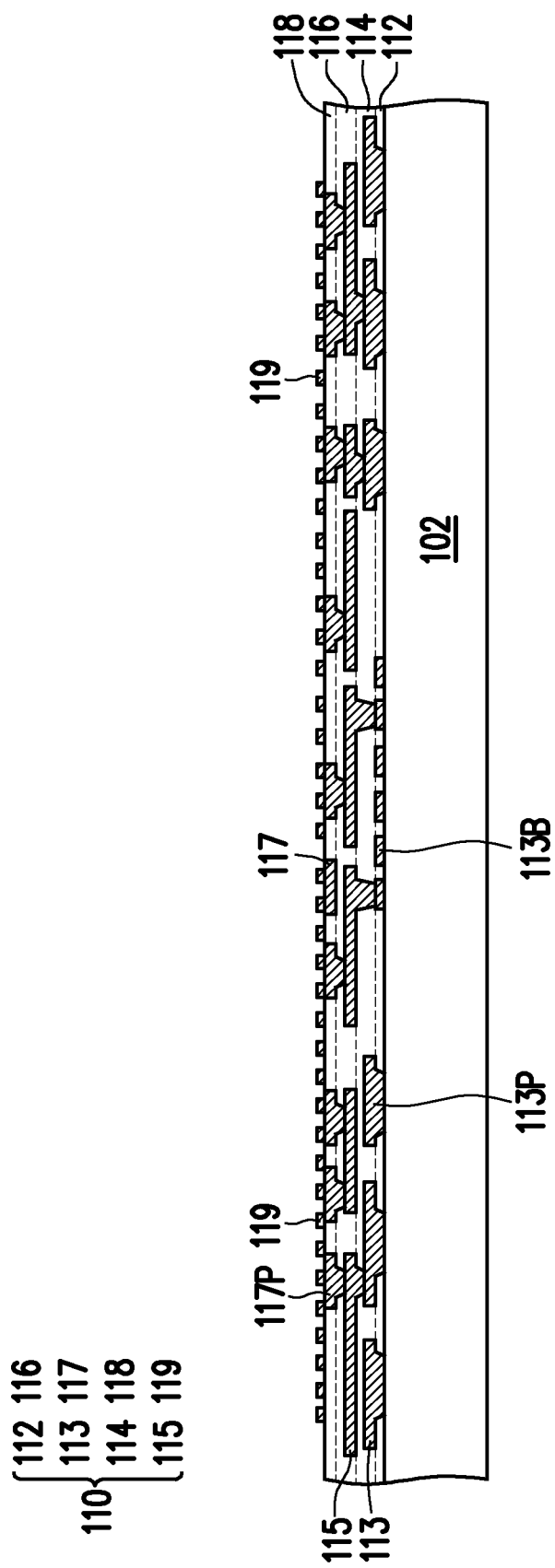
FIG. 1 to FIG. 6 are schematic cross-sectional views of various stages in a manufacturing method of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 6 are schematic cross-sectional views of various stages in a manufacturing method of a semiconductor package according to some exemplary embodiments of the present disclosure. In some embodiments, one or more dies are shown to represent plural dies, and one or more packages are shown to represent plural semiconductor packages obtained following the semiconductor manufacturing method.

Referring to FIG. 1, in some embodiments, a carrier 102 having a debond layer (not shown) thereon is provided. In some embodiments, the carrier 102 is a semiconductor substrate such as a bulk silicon wafer or a glass substrate. For example, the debond layer may include a light-to-heat conversion (LTHC) release layer.

Referring to FIG. 1, in some embodiments, a redistribution layer 110 is formed on the carrier 102. The formation of the redistribution layer 110 includes sequentially forming more than one dielectric material layers and more than one metallization layers in alternation. Referring to FIG. 1, in certain embodiments, the formation of the redistribution layer 110 includes sequentially forming a first dielectric material layer 112, a first metallization layer 113, a second dielectric material layer 114, a second metallization layer 115, a third dielectric material layer 116, a third metallization layer 117, a fourth dielectric material layer 118 and joining portions 119. In some embodiments, the formation of the redistribution layer 110 further includes forming a layer of dielectric material (not shown), patterning the layer of dielectric material to form openings, depositing a metallic material filling up the openings to form metallization patterns. In some embodiments, the metallization layers 113, 115, 117 and the joining portions 119 are electrically interconnected.

In some embodiments, the materials of the dielectric material layers 112, 114, 116, 118 may be the same or different. In some embodiments, the materials of the dielectric material layers 112, 114, 116, 118 include one or more polymer dielectric materials such as polyimide, benzocyclobutene (BCB), polybenzoxazole (PBO), or any other suitable polymer-based dielectric materials. In some embodiments, the materials of the metallization layers 113, 115, 117 and the joining portions 119 may be the same or different, and the materials of the metallization layers 113, 115, 117 and the joining portions 119 may be selected from copper, cobalt, nickel, aluminum, tungsten or combinations thereof. In some embodiments, the metallization layers 113, 115, 117 may include routing traces or fan-out traces. In some embodiments, the first metallization layer 113 may include bonding portions 113B and pads 113P. In some embodiments, the third metallization layer 117 may include contact pads 117P connected with the joining portions 119 for receiving bumps or other components. In some embodiments, the joining portions 119 further optionally includes an adhesion layer, a seed layer, pre-solder, solder paste and/or under-ball metallurgy (UBM) patterns formed on the surfaces of the joining portions for enhancing bonding.

Figure 2:
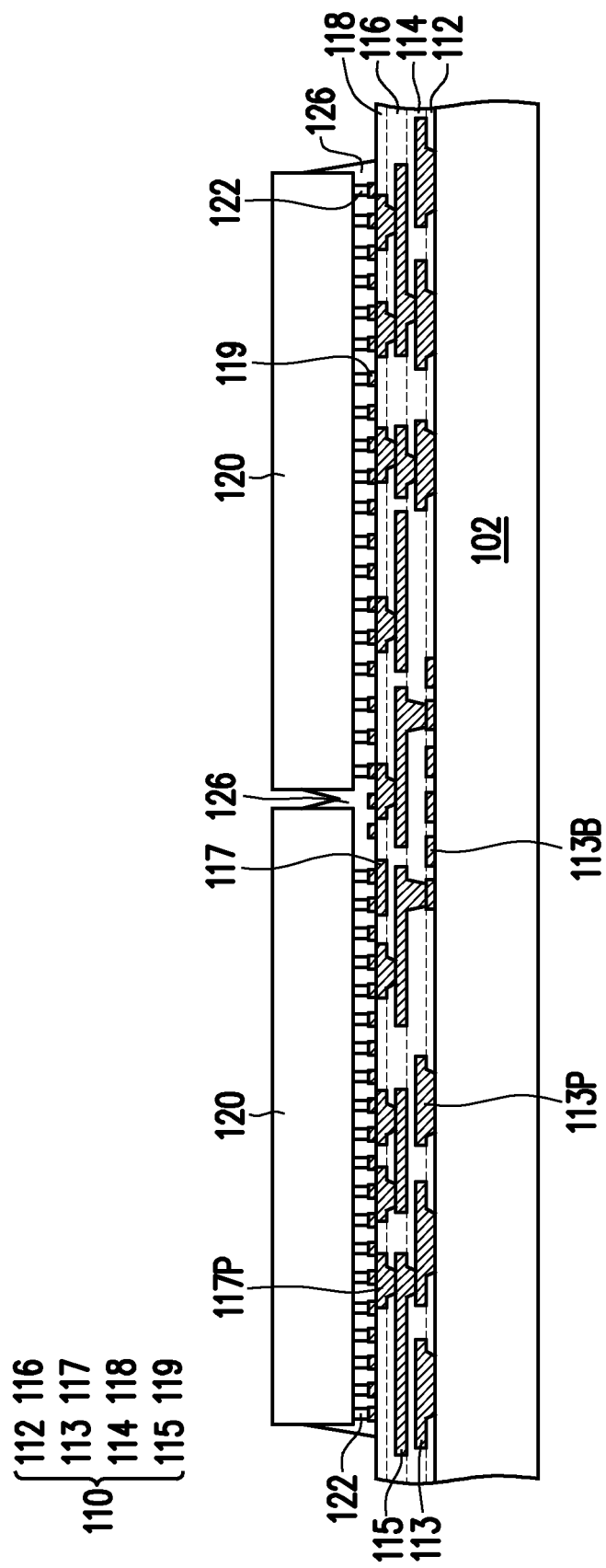

Referring to FIG. 2, two or more semiconductor dies 120 are provided and placed over the redistribution layer 110 over the carrier 102. In FIG. 2, only two dies are shown as the exemplary dies of the package structure, but it is understood that more than two dies or different types of dies may be included within the package structure. In some embodiments, one or more of the dies 120 include one or more memory chips, such as high bandwidth memory chips, dynamic random access memory (DRAM) chips or static random access memory (SRAM) chips. In some embodiments, one or more of the dies 120 may include one or more of an application-specific integrated circuit (ASIC) chip, an analog chip, a sensor chip, a wireless application chip (such as a Bluetooth chip or a radio frequency chip) or a voltage regulator chip. In some embodiments, one of the dies 120 may be a memory die including memory chips, and the other die 120 may be a system-on-chip (SoC) die including a controller chip. In certain embodiments, dies and chips may be used interchangeably.

In certain embodiments, in FIG. 2, the semiconductor dies 120 are provided with contacts 122 facing downward, and the contacts 122 of the semiconductor dies 120 are bonded to the joining portions 119 of the redistribution layer 110. In one embodiment, the bonding of the semiconductor dies 120 to the redistribution layer 110 includes performing a reflow process to bond the contacts 122 and the joining portions 119 through a solder flux. In some embodiments, the contacts 122 are metal pillars, micro-bumps, copper posts, copper alloy posts or other suitable metallic connectors. In certain embodiments, the semiconductor dies 120 are mounted on the redistribution layer 110 over the carrier 102 side-by-side, and the number of the dies arranged side-by-side or stacked over another die(s) may be adjusted or modified based on the product design but are not limited by the exemplary embodiments. In some embodiments, an underfill 126 is filled between the semiconductor dies 120 and the redistribution layer 110, encapsulating the bonded contacts 112 and joining portions 119 for better attachment. In some embodiments, the underfill 126 at least partially fills the gaps between the semiconductor dies 120.

Figure 3:
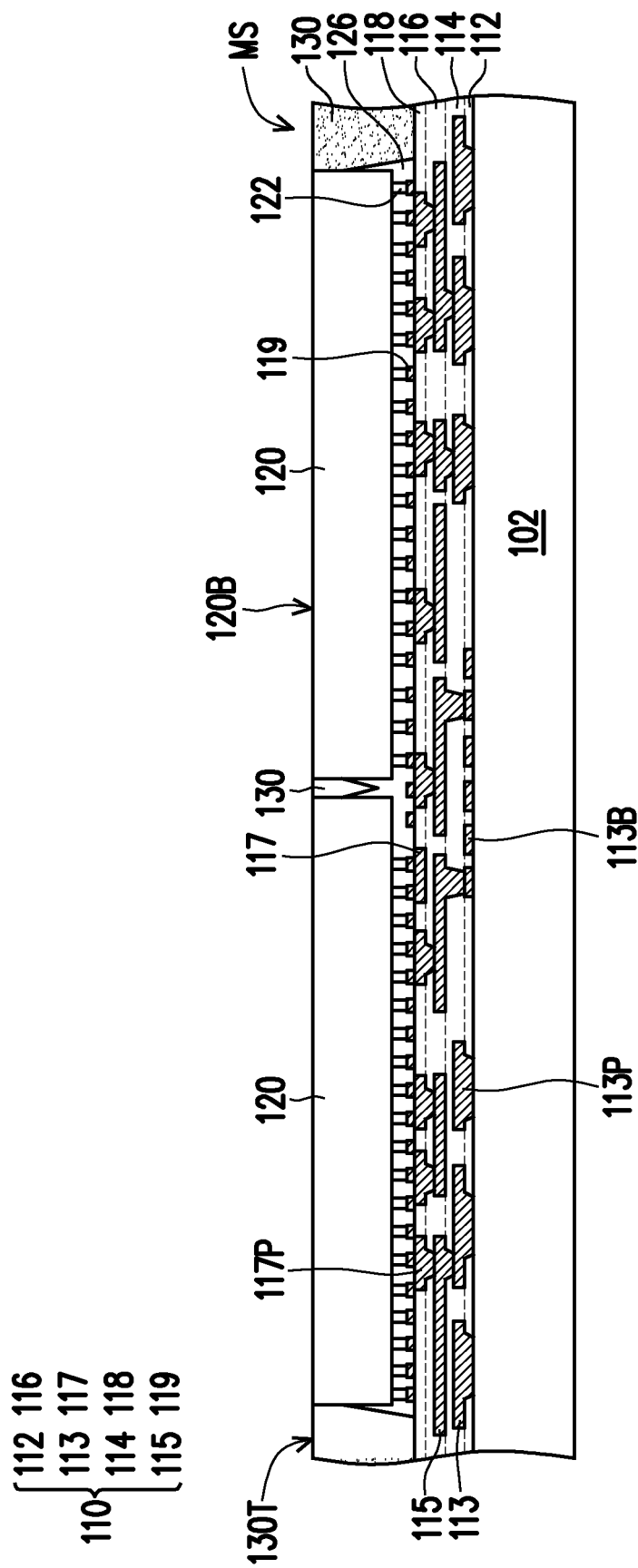

Referring to FIG. 3, in some embodiments, the semiconductor dies 120 located on the redistribution layer 110 are molded and encapsulated in a molding compound 130 to form a molded structure MS. In one embodiment, the molding compound 130 fills the spaces between the dies 120 and at least laterally covers the dies 120 on the redistribution layer 110. In one embodiment, the material of the molding compound 130 includes epoxy resins, phenolic resins or silicon-containing resins. In some embodiments, the material of the molding compound 130 includes filler particles. In some embodiments, the molding compound 130 is overmolded and then planarized to expose back surfaces 120B of the dies 120. In some embodiment, the over-molded molding compound 130 is polished until the back surfaces 120B of the dies 120 are exposed. In one embodiment, after the planarization, a top surface 130T of the molding compound 130 and the back surfaces 120B of the dies 120 become substantially levelled and flush with one another. In some embodiments, the molding compound 130 is planarized through a grinding process or a chemical mechanical polishing (CMP) process.

Figure 4:
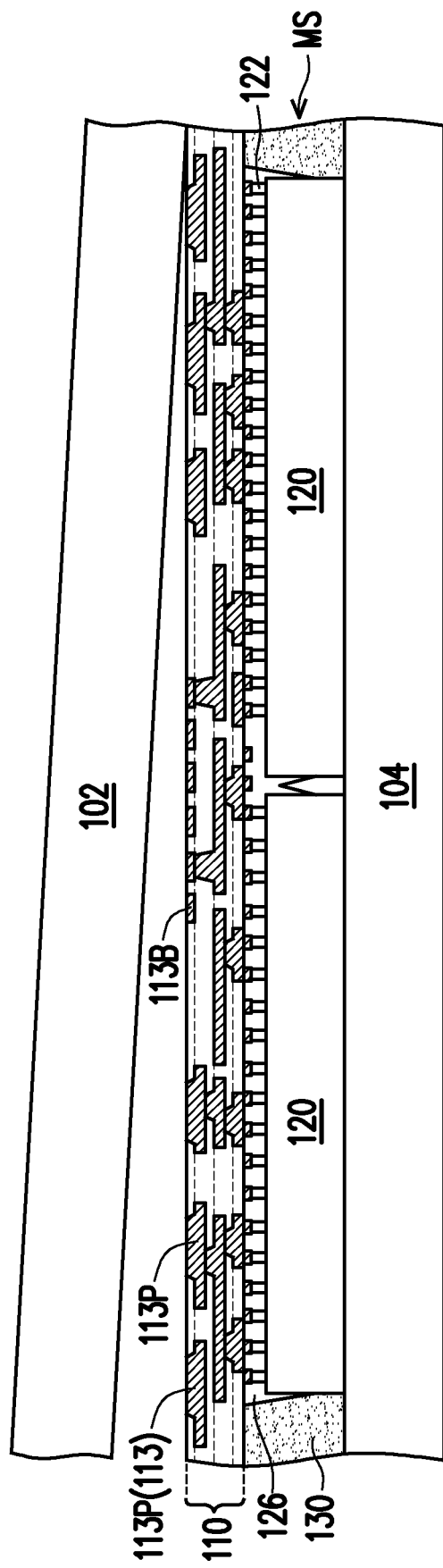

Referring to FIG. 4, in some embodiments, after another carrier 104 is attached to the molded structure MS (attached to the back surfaces 120B of the dies 120), the whole structure is turned upside down (flipped), and the carrier 102 is detached from the molded structure MS through the debond layer (not shown) and then removed. After the carrier 102 is detached from the molded structure MS, the first metallization layer 113 including the bonding portions 113B and pads 113P is exposed from the surface 110S of the redistribution layer 110.

Figure 5:
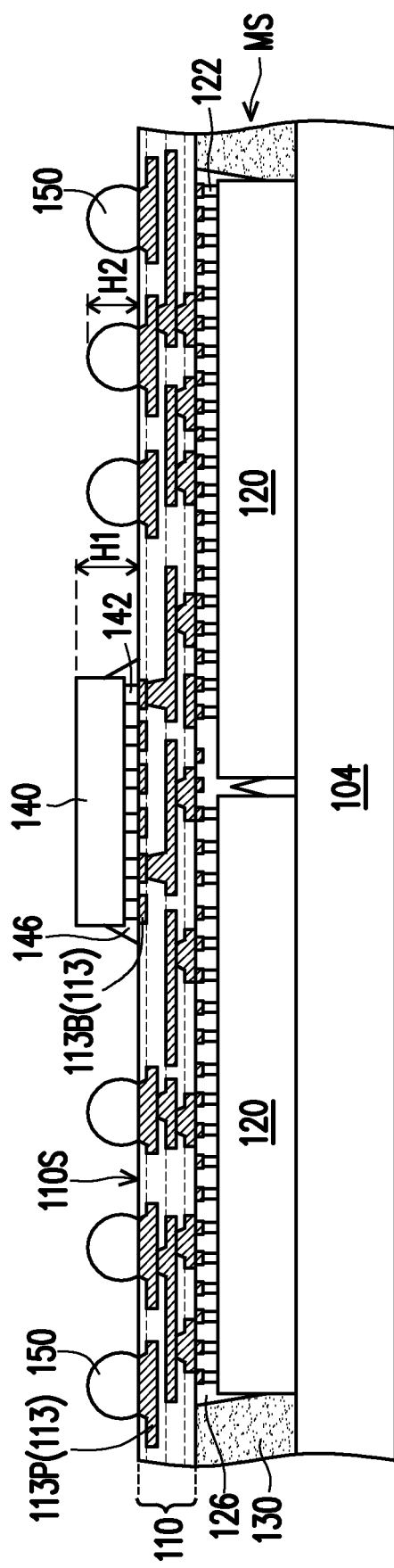

In some embodiments, referring to FIG. 5, another semiconductor die 140 is bonded to the redistribution layer 110 and conductive elements 150 are formed on the redistribution layer 110. In some embodiments, the semiconductor die 140 has a first height H1 (vertically measuring from the surface 110S in the thickness direction), and the conductive elements 150 has a second height H2 (vertically measuring from the surface 110S in the thickness direction), and the second height H2 is smaller than the first height H1. In some embodiments, the conductive elements 150 are disposed beside the semiconductor die 140. In some embodiments, the semiconductor die 140 is provided with contacts 142 facing downward, and the semiconductor die 140 is mounted onto the first metallization layer 113 of the redistribution layer 110. In some embodiments, the semiconductor die 140 is bonded to the redistribution layer 110 and the contacts 142 of the semiconductor die 140 are bonded and connected to the bonding portions 113B of the redistribution layer 110. In some embodiments, the sizes or dimensions of the contacts 142 of the semiconductor die 140 are larger than the sizes or dimensions of the contacts 122 of the semiconductor dies 120. In some embodiments, the contacts 142 are metal pillars, micro-bumps, copper posts, copper alloy posts or other suitable metallic connectors. In FIG. 5, only one semiconductor die is shown as the exemplary die of the package structure, but it is understood that two or more dies or different types of semiconductor dies may be included within the package structure. In some embodiments, an underfill 146 is formed between the semiconductor die 140 and the redistribution layer 110 and encapsulating the bonded contacts 146 and the bonding portions 113B for better attachment. In one embodiment, the bonding of the semiconductor die 140 to the redistribution layer 110 includes performing a reflow process to bond the contacts 142 and the bonding portions 113B through a solder flux. In some embodiments, the conductive elements 150 are disposed on the first metallization layer 113 and are fixed to the contact pads 113P by performing a ball placement process and then a reflow process. In some embodiments, the conductive elements 150 are, for example, micro-bumps, metal posts, metal posts with solder paste, electroless nickel electroless palladium immersion gold (ENEPIG) formed bumps, or controlled collapse chip connection (C4) bumps. As shown in the FIG. 5, some of the conductive elements 150 are electrically connected to the semiconductor die(s) 120 through the redistribution layer 110, and some of the conductive elements 150 are electrically connected to the semiconductor die 140 through the redistribution layer 110. In some embodiments, the semiconductor die 140 is electrically connected with the semiconductor die(s) 120 through the redistribution layer 110, and the semiconductor dies 120 are electrically connected through the redistribution layer 110. In some embodiments, the semiconductor die 140 may include one or more passive components, such as capacitors, inductors or resistors. In some embodiments, the semiconductor die 140 may include integrated passive devices (IPDs).

Figure 6:
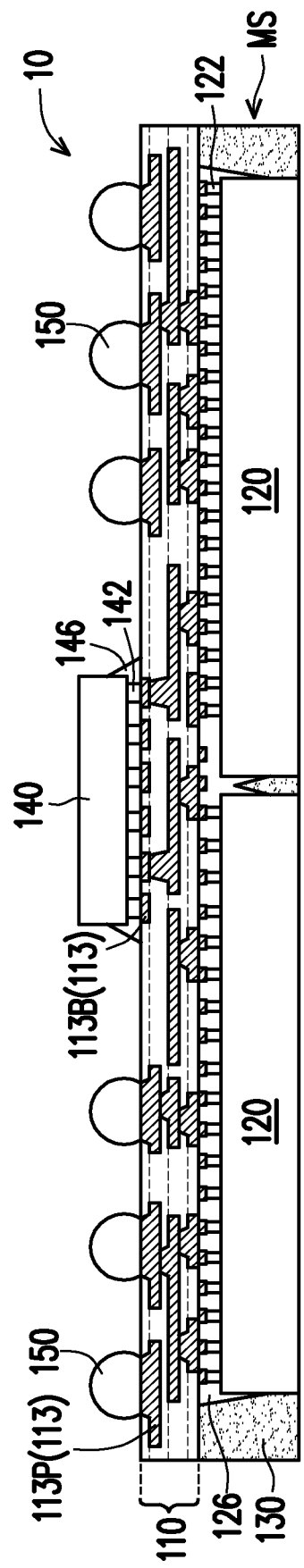

Referring to FIG. 6, in some embodiments, along the cutting lanes (not shown), a dicing process is performed to cut the whole structure (at least cutting though the redistribution layer 110 and the molding compound 130) into individual and separated semiconductor packages 10. In one embodiment, the dicing process is a wafer dicing process including mechanical sawing or laser cutting. In some embodiments, the carrier 104 is removed.

Figure 7:
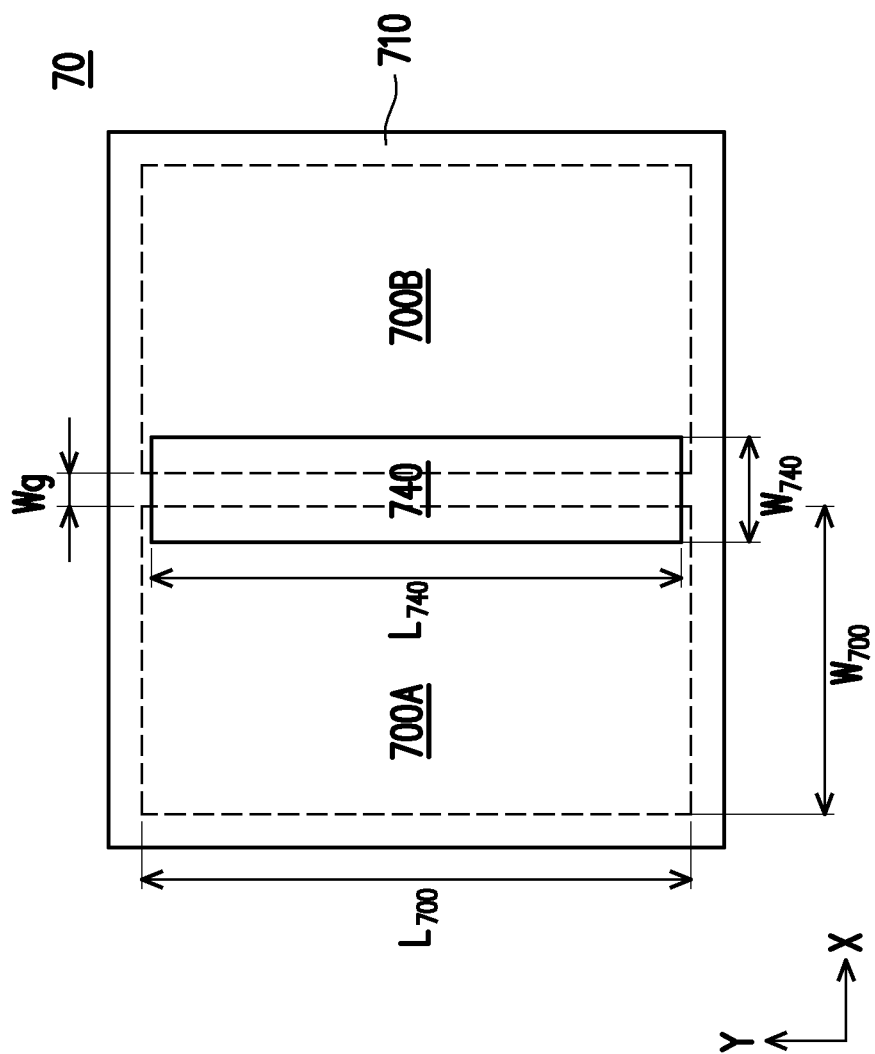
FIG. 7 to FIG. 9 are schematic planar views of a semiconductor package according to some embodiments of the present disclosure.
Figure 8:
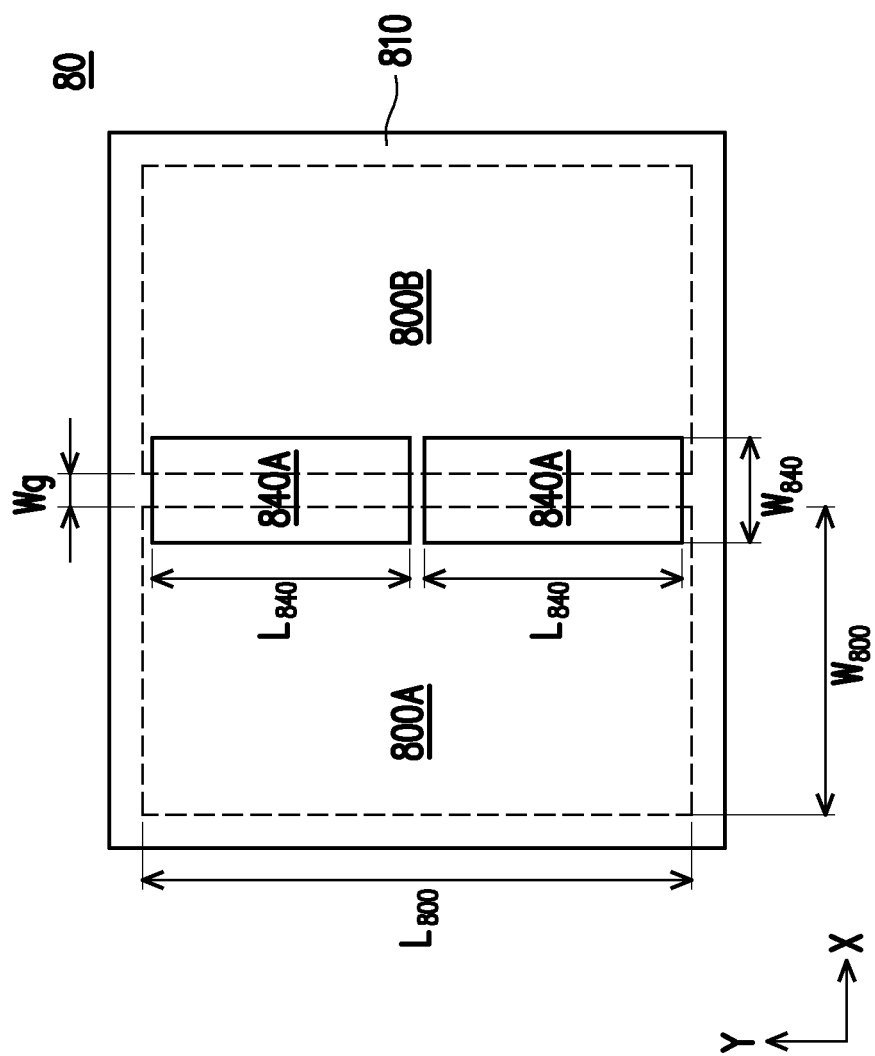
Figure 9:
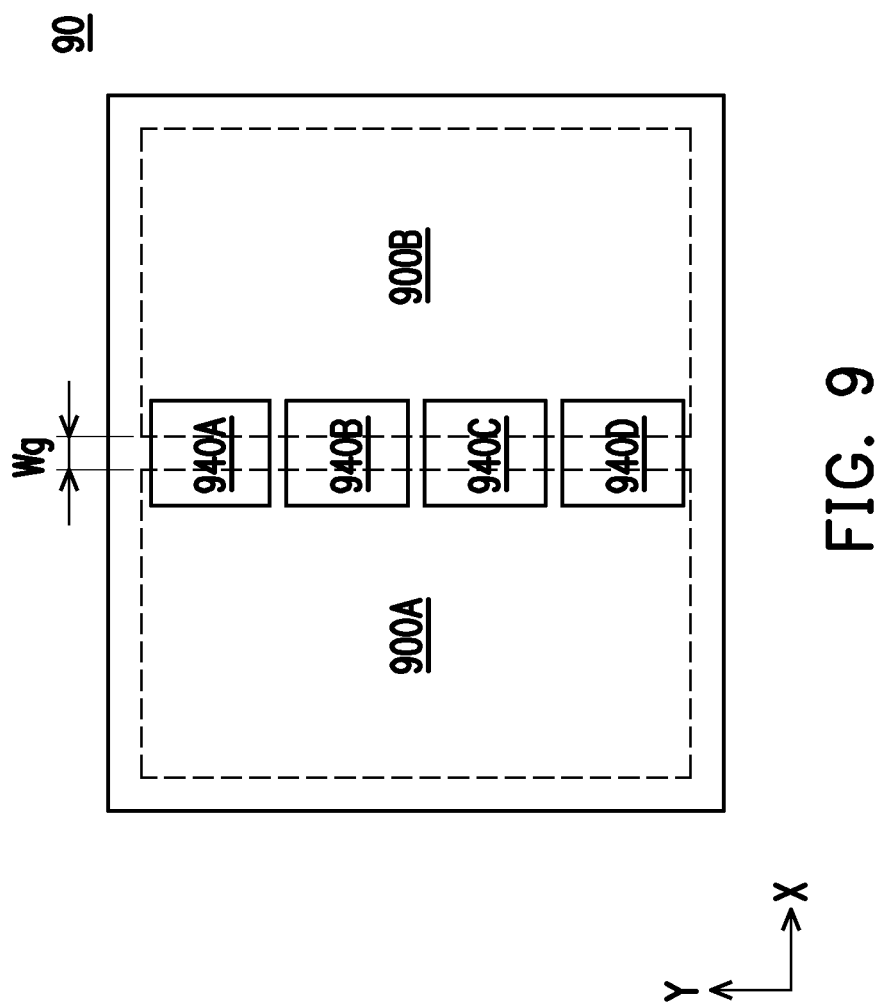

FIG. 7 to FIG. 9 are schematic planar views of a semiconductor package according to some embodiments of the present disclosure. It should be noted that the package units or structures in FIG. 7 to FIG. 9 are for illustration only, and the embodiments in FIG. 7 to FIG. 9 are within the contemplated scope of the present disclosure that the structures described with reference to FIG. 1 to FIG. 6.

Referring to FIG. 7, the package structure 70 is similar to the package structure 10 shown in the previous embodiments, but the illustration is simplified to show the relative arrangement of the semiconductor dies in the package structure 70. In some embodiments, the semiconductor die 740 and the semiconductor dies 700A and 700B are located at two opposite sides of the redistribution layer 710. As seen in FIG. 7, the semiconductor dies 700A and 700B are arranged side-by side and located under the redistribution layer 710, and another semiconductor die 740 is mounted on the redistribution layer 710 and at a central location between the underlying two semiconductor dies 700A, 700B. In one embodiment, the semiconductor dies 700A and 700B are the same type of dies, and the semiconductor dies 700A, 700B and 740 are different types of dies. In one embodiment, the semiconductor dies 700A and 700B are different types of dies, and the semiconductor dies 700A, 700B and 740 are different types of dies. From the planar view of FIG. 7, the die 700A or 700B has a length L700 and a width W700, and the die 740 has a length L740 and a width W740. In FIG. 7, in some embodiments, the vertical projection (along the thickness direction) of the semiconductor die 740 is partially overlapped with both of the semiconductor dies 700A and 700B. In some embodiments, the span of the semiconductor die 740 extends along the adjacent long sides of the semiconductor dies 700A, 700B and spreads from one semiconductor die 700A to another semiconductor die 700B so that the semiconductor die 740 overlaps the semiconductor dies 700A and 700B. In one embodiment, the length L700 is larger than the length L740, and a ratio of L740/L700 ranges from about 0.1 to about 0.95. In one embodiment, the width L740 is smaller than the width W700 but larger than the width Wg of the gap between the semiconductor dies 700A and 700B. In one embodiment, the width Wg of the gap ranges from about 1 micron to about 200 microns.

Referring to FIG. 8, the package structure 80 is similar to the package structure 10 shown in the previous embodiments, but the illustration is simplified to show the relative arrangement of the semiconductor dies in the package structure 80. In some embodiments, the semiconductor dies 840A, 840B and the semiconductor dies 800A and 800B are located at two opposite sides of the redistribution layer 810. As seen in FIG. 8, the semiconductor dies 800A and 800B are arranged side-by side and located at the bottom side of the redistribution layer 810, and semiconductor dies 840A, 840B are mounted onto the top side of the redistribution layer 810 and at a central location between the underlying two semiconductor dies 800A, 800B. In one embodiment, the semiconductor dies 800A and 800B are the same type of dies, and the semiconductor dies 840A, 840B are the same type of dies but different from the dies 800A, 800B. In one embodiment, the semiconductor dies 800A and 800B are different types of dies, and the semiconductor dies 840A, 840B are different types of dies and different from the dies 800A, 800B. From the planar view of FIG. 8, the die 800A or 800B has a length L800 and a width W800, and the dies 840A or 840B has a length L840 and a width W840. In FIG. 8, in some embodiments, the vertical projection (along the thickness direction) of the semiconductor die 840A or 840B is partially overlapped with both of the semiconductor dies 800A and 800B. In some embodiments, the spacing between the semiconductor dies 840A and 840B ranges from about 1 micron to about 1000 microns. In one embodiment, the length L800 is larger than the length L840, the width L840 is smaller than the width W800 but larger than the width Wg of the gap between the semiconductor dies 800A and 800B.

Referring to FIG. 9, the package structure 90 is similar to the package structure 10 shown in the previous embodiments, but the illustration is simplified to show the relative arrangement of the semiconductor dies in the package structure 90. In some embodiments, the semiconductor dies 940A, 940B, 940C, 940D and the semiconductor dies 900A and 900B are respectively located at two opposite sides of the redistribution layer 910. As seen in FIG. 9, the semiconductor dies 900A and 900B are arranged side-by side and located at the bottom side of the redistribution layer 910, and semiconductor dies 940A, 940B, 940C, 940D are mounted onto the top side of the redistribution layer 910 and at a central location between the underlying two semiconductor dies 900A, 900B. In one embodiment, the semiconductor dies 940A, 940B, 940C, 940D are the same type of dies but different from the dies 900A, 900B. In one embodiment, the semiconductor dies 900A and 900B are different types of dies, and the semiconductor dies 940A, 940B, 940C, 940D are different types of dies and different from the dies 900A, 900B. In FIG. 9, in some embodiments, the vertical projection (along the thickness direction) of the semiconductor die 940A, 940B, 940C or 940D is partially overlapped with both of the semiconductor dies 900A and 900B. In some embodiments, the spacing between the semiconductor dies 940A, 940B, 940C, 940D ranges from about 1 micron to about 1000 microns. In one embodiment, either of the semiconductor dies 940A, 940B, 940C, 940D has a width larger than the width Wg of the gap between the semiconductor dies 900A and 900B. The spacing between the adjacent dies 940A, 940B, 940C, 940D may be adjusted based on the product design.

Figure 14A:
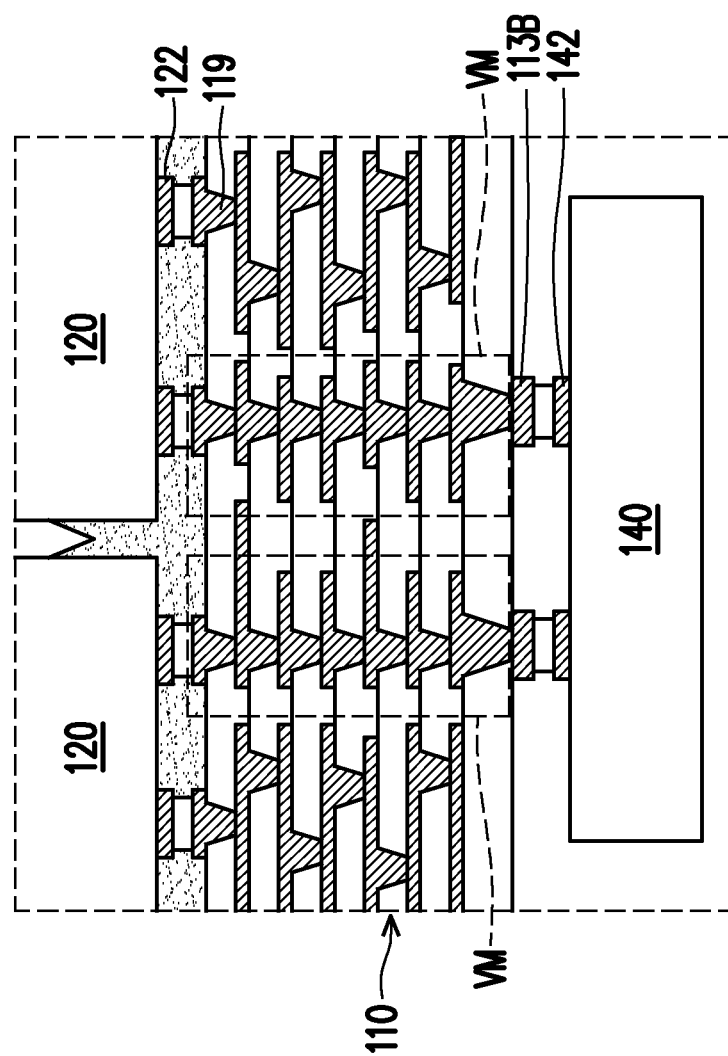
FIG. 14A is a schematic enlarged partial cross-sectional view showing a connected portion of the semiconductor package structure according to some exemplary embodiments of the present disclosure.
Figure 14B:
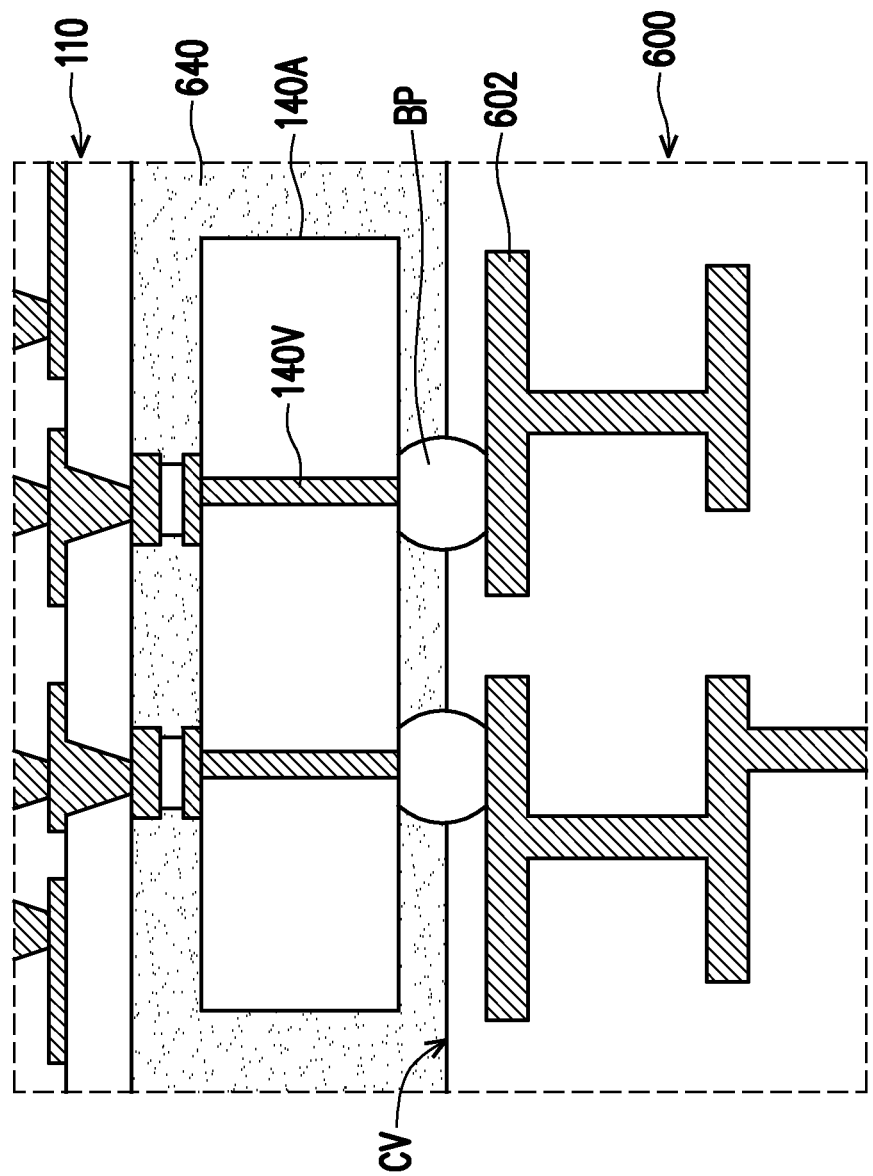
FIG. 14B is a schematic enlarged partial cross-sectional view showing another connected portion of the semiconductor package structure connected to a circuit substrate according to some exemplary embodiments of the present disclosure.
Figure 15A:
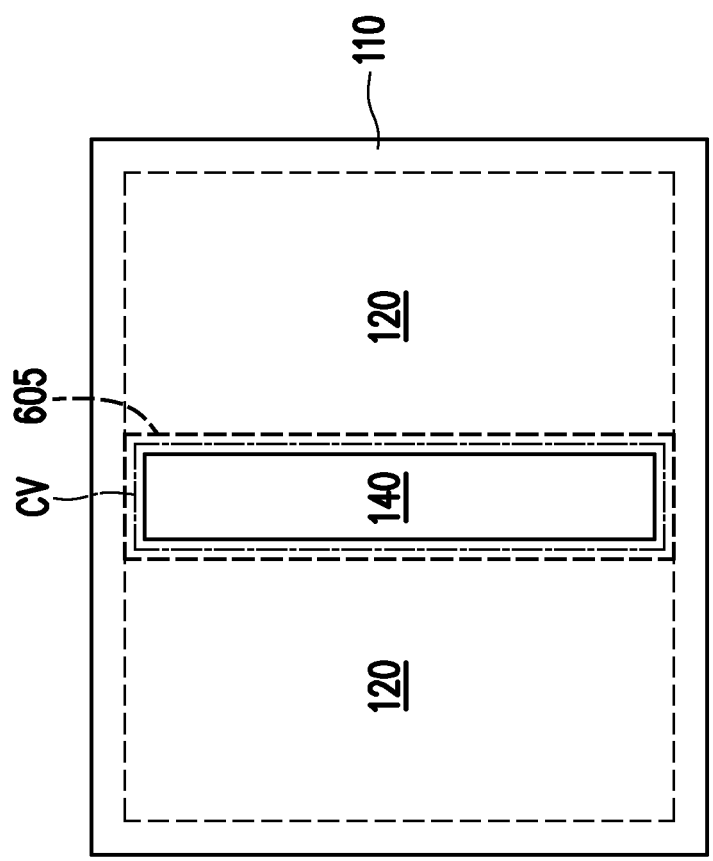
FIG. 15A and FIG. 15B are schematic planar views showing the relative configurations of the floor plate and the cavity of a semiconductor package connected to a circuit substrate according to some embodiments of the present disclosure.
Figure 15B:
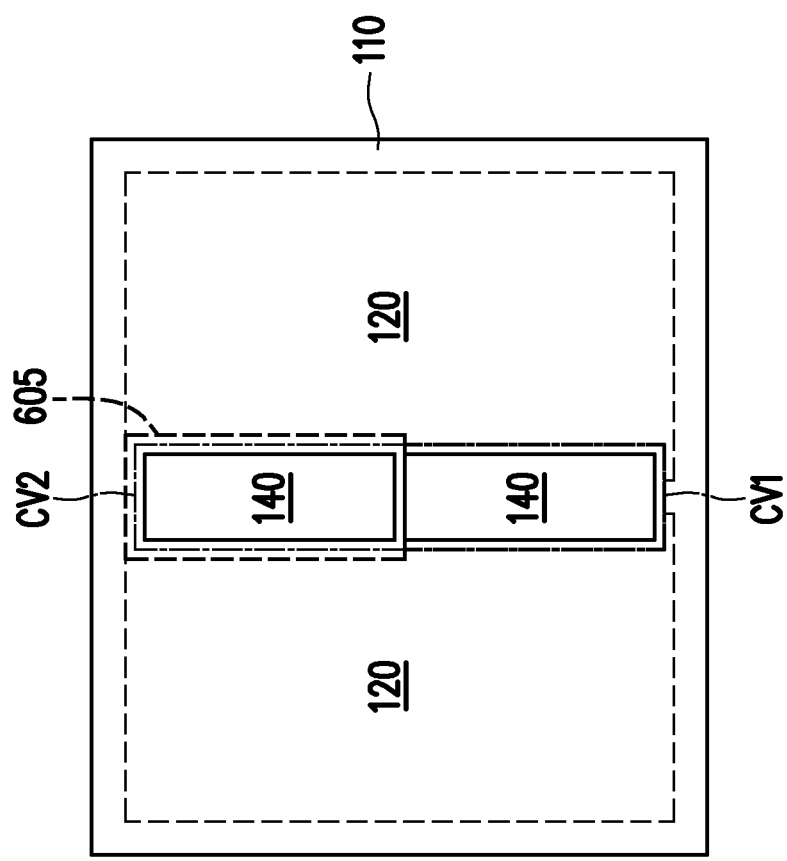

FIG. 10 to FIG. 13 are schematic cross-sectional views illustrating the structures formed at various stages of a manufacturing method of a semiconductor package connected to a circuit substrate according to some embodiments of the present disclosure. FIG. 13A is a schematic cross-sectional view illustrating the semiconductor package connected to the circuit substrate according to some embodiments of the present disclosure. FIG. 14A is a schematic enlarged partial cross-sectional view showing a connected portion of the semiconductor package structure according to some exemplary embodiments of the present disclosure. FIG. 14B is a schematic enlarged partial cross-sectional view showing another connected portion of the semiconductor package structure connected to a circuit substrate according to some exemplary embodiments of the present disclosure. FIG. 15A and FIG. 15B are schematic planar views showing the relative configurations of the floor plate and the cavity of a semiconductor package connected to a circuit substrate according to some embodiments of the present disclosure. It should be noted that the configurations shown in FIG. 14A to FIG. 15B are for illustration only, and these configurations or schemes are within the contemplated scope of the present disclosure that the structures described with reference to FIG. 10 to FIG. 13.

Figure 10:
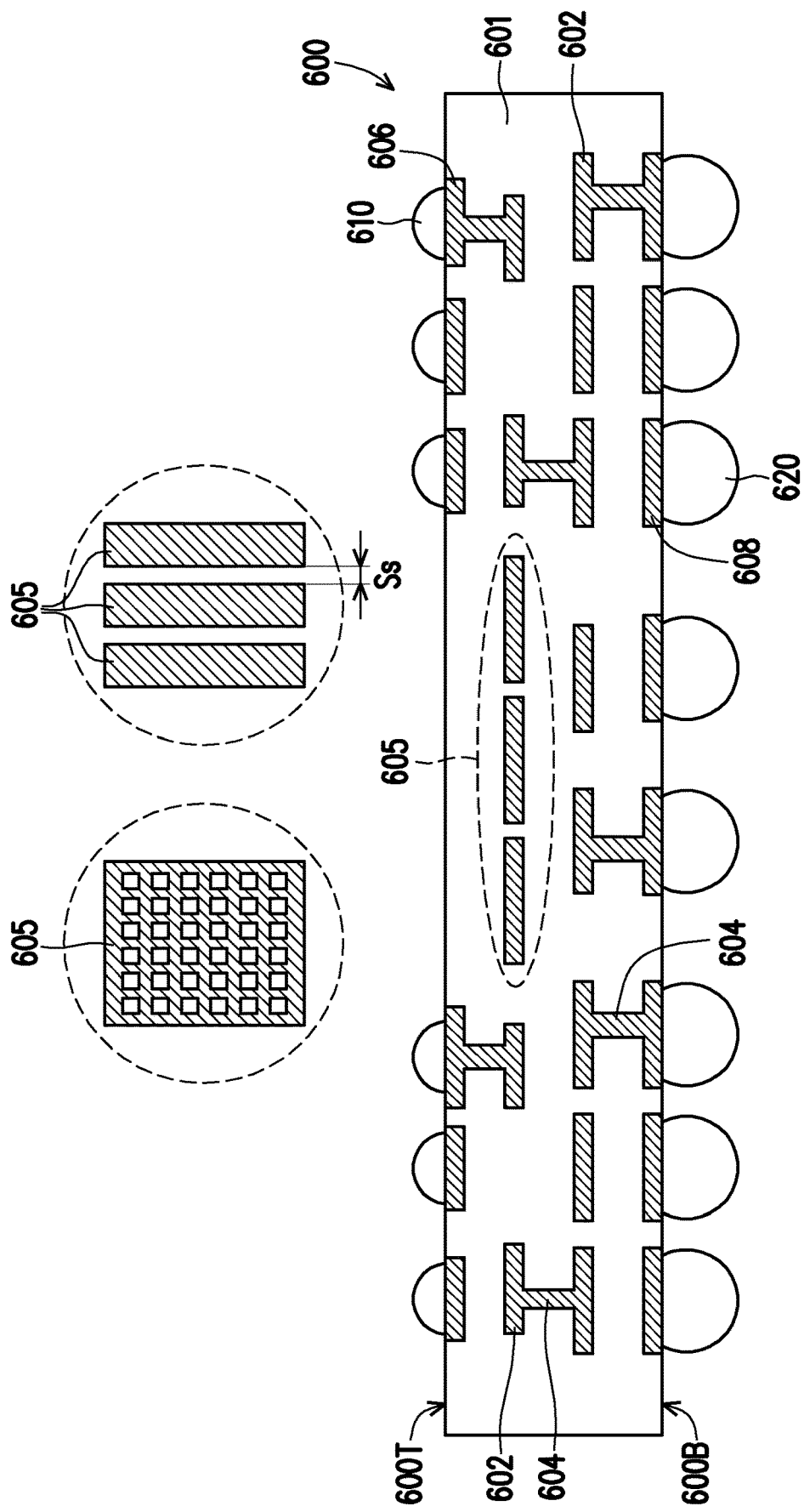
FIG. 10 to FIG. 13 are schematic cross-sectional views illustrating the structures formed at various stages of a manufacturing method of a semiconductor package connected to a circuit substrate according to some embodiments of the present disclosure.

In some embodiments, referring to FIG. 10, a circuit substrate 600 is provided. In some embodiments, the circuit substrate 600 includes a build-up board, a printed circuit board, a laminated board or a flexible laminate board. In some embodiments, the circuit substrate 600 may include one or more active components, passive components, or a combination thereof. In some embodiments, the circuit substrate 600 includes a dielectric material 601, metallization patterns 602, though vias 604 and bond pads 606 and 608 connected to the metallization layers 602 and the vias 604 to provide, for example, dual-side electrical connection. In some embodiments, the metallization patterns 602 include one or more floor plates 605 embedded in the dielectric material 601. As seen in above enlarged planar view at the right side in FIG. 10, in some embodiments, the floor plates 605 include three strip plates spaced from one another with a distance Ss and arranged in parallel. In one embodiment, the distance Ss ranges from about 1 micron to about 200 microns. In one embodiment, as seen in above enlarged planar view at the left side in FIG. 10, the floor plate 605 is a single metallic plate with openings or with a mesh pattern. In some embodiments, the metallization patterns 602 are designed to electrically connect the various components such as the active components and/or passive components embedded in the circuit substrate to form functional circuitry. In certain embodiments, joining connectors 610 are formed on the bonding pads 606 on the top surface 600T of the circuit substrate 600. In some embodiments, the joining connectors 610 include solder paste or pre-solder paste, micro-bumps, metal posts or metal pillars with solder paste. In some embodiments, conductive balls 620 may be formed on the contact pads 608 on the bottom surface 600B of the circuit substrate 600 for further electrical connection. In some embodiments, the conductive balls 620 include solder balls, ball grid array (BGA) connectors, controlled collapse chip connection (C4) bumps.

In some embodiment, the material of the metallization patterns includes a metallic material includes copper, aluminum, nickel, cobalt, gold, silver, tungsten a combination thereof, or the like. In one embodiment, the dielectric material 601 includes an organic dielectric material. In some embodiments, the dielectric material 601 may include Ajinomoto build-up films, polymeric materials (e.g., polyimide, polyesters, benzocyclobutene, polybenzoxazole, or the like), prepreg, resin coated copper (RCC), photo image dielectric (PID), phenolic paper, phenolic cotton paper, woven fiberglass cloth, impregnated woven fiberglass cloth, a molding compound, or a combination thereof. In some embodiments, the dielectric material 601 of the circuit substrate 600 may be formed by compression molding, over-molding and planarization, lamination, or other suitable techniques. In some embodiments, the metallization patterns 602, the vias 604 and the pads 606, 608 may be formed by one or more plating processes, for example, electro-plating, electroless-plating, immersion plating, or the like.

Figure 11:
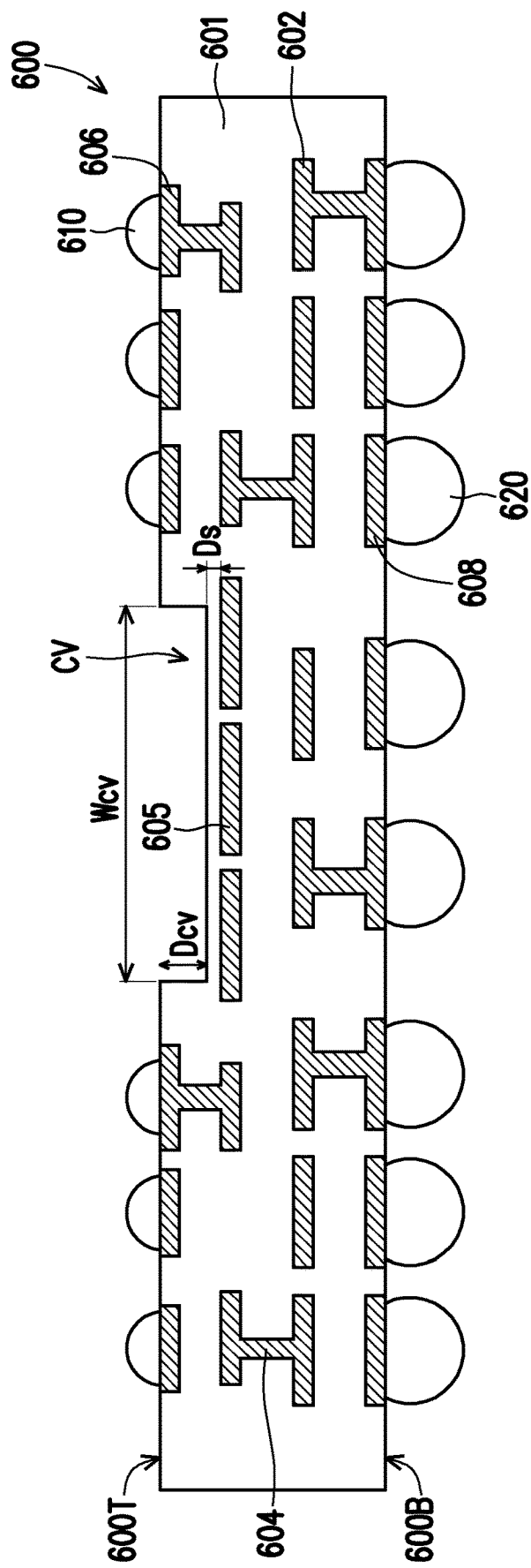

In some embodiments, referring to FIG. 11, a cavity CV is formed in the circuit substrate 600. In FIG. 11, in some embodiments, the cavity CV is concave into the circuit substrate 600 with a depth Dcv (measuring from the top surface 600T) and stops before reaching the floor plate(s) 605. In some embodiments, the cavity CV has a width Wcv ranging from about 10 microns to about 10 centimeters. In some embodiments, the sizes of the cavity are large enough to accommodate later-disposed dies or package units. In embodiments, the cavity CV is formed by performing a mechanical ablation process or a laser ablation process to the circuit substrate 600, and from the top surface 600T, portions of the dielectric material 601 is removed to form the cavity CV in the circuit substrate 600. In some embodiments, the cavity CV is formed in a keep-out region where no metallization patterns or wiring present and the formation of the cavity CV only involves removing the dielectric material 601 in the region. That is, the exposed surfaces of the cavity CV are metallization-free (metal-free) dielectric surfaces. In some embodiments, the floor plate(s) 605 embedded in the dielectric material 601 is located below the keep-out region, and the cavity CV is formed by removing the dielectric material 601 above the floor plate(s) 605. In one embodiment, during the formation of the cavity CV, the removal of the dielectric layer 601 stops at a distance before reaching the floor plate(s) 605, and the floor plate(s) 605 may function as a buffer or a barrier layer or even a marking for precisely controlling the removal process. In one embodiment, as the cavity CV is formed by removing the dielectric material 601, rather than metallic materials, the dimensions of the cavity CV is well controlled with better surface planarity. In one embodiment, the bottom of the cavity CV is spaced apart from the floor plate(s) 605 with a distance Ds. In one embodiment, the spacing distance Ds ranges from about 1 micron to about 100 microns. In other words, the dielectric material 601 sandwich between the bottom of the cavity and the floor plate(s) 605 has a thickness ranging from about 1 micron to about 100 microns. In some embodiments, in FIG. 10 and FIG. 11, the floor plates 605, shaped as three strips, are located right below the cavity CV and the floor plates 605 are electrically floating and electrically isolated from other metallization patterns 602 by the dielectric material 601. In some embodiments, the location of the cavity CV corresponds to the distribution location(s) of the floor plates 605.

Referring to FIG. 15A and FIG. 15B, the configurations and position of the floor plate(s) 605 and the cavity CV are shown relative to the package structure 10 bonded to the circuit substrate 600 are shown, but certain elements are omitted and the illustration is simplified. Referring to FIG. 11 and the planar view of FIG. 15A, it is seen that the span of the cavity CV is fully overlapped with the span of the floor plates 605. In one embodiment, the span of the floor plates 605 is larger than the span of the cavity CV and from the planar view, the distribution span of the floor plates 605 and the span of the cavity CV are arranged in a concentric way. It is understood that one cavity is shown herein as an example, but more than one cavity may be possible and the shape and number of the cavity formed in the circuit substrate may be modified depending on the dies to be accommodated into the cavity. From the planar view of FIG. 15B, there are two cavities CV1 and CV2 to accommodate two semiconductor dies 140, and the floor plate(s) 605 is located under the cavity CV2 with a span larger than the span of the cavity CV2. In some embodiments, there is no floor plate located under the cavity CV1, but other functioning metallization patterns may be present below the cavity CV1.

Figure 12:
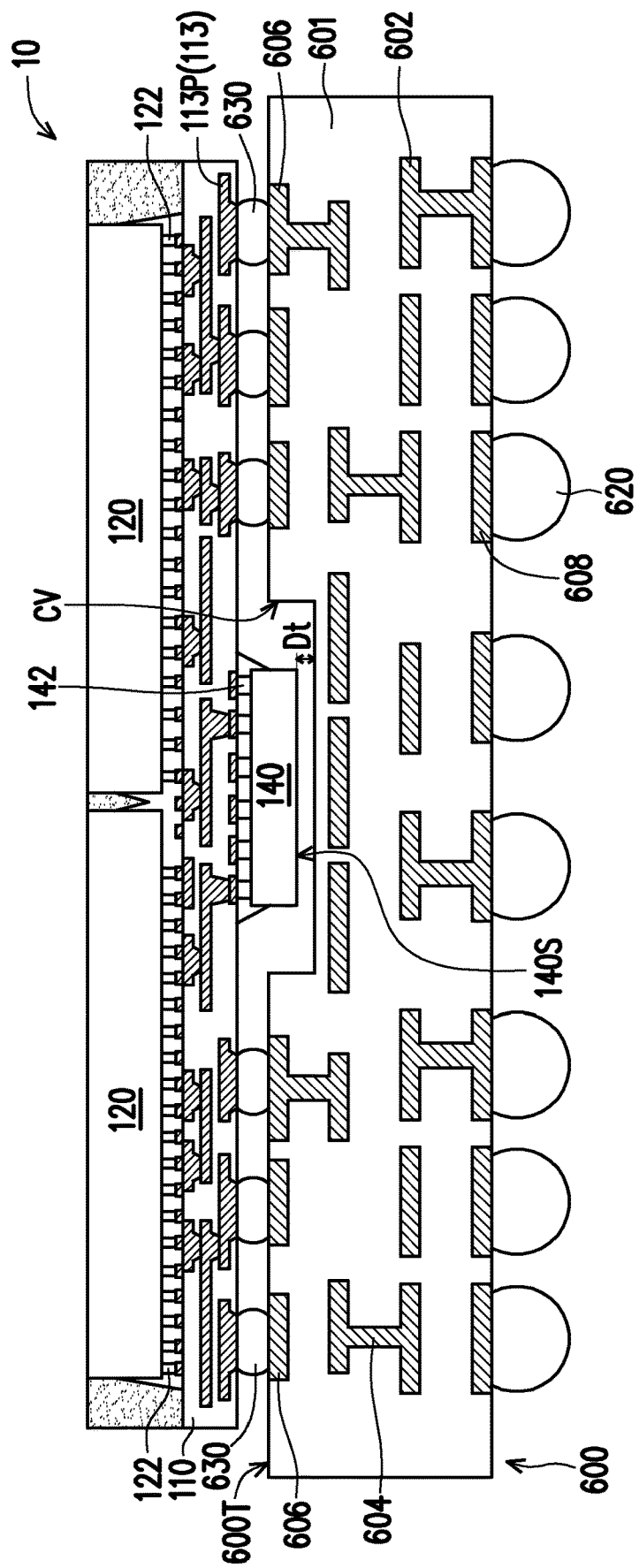

In some embodiments, as illustrated in FIG. 12, the package structure 10, which is similar to the package unit as described in FIG. 6, is mounted to the top surface 600T of the circuit substrate 600 and the package structure 10 is bonded to pads 606 of the circuit substrate 600 via the joining connectors 610 and the connectors 150. In some embodiments, through performing a reflow process, the connectors 150 of the package structure 10 and the joining connectors 610 of the substrate 600 are joined and fused together to become fused connectors 630. In some embodiments, the reflow process includes performing a thermal process to turn the connectors 150 into a melted state or a semi-melted state to integrate and bond with the joining connectors 610 to become the fused connectors 630 located between the package structure 10 and the circuit substrate 600. The reflow temperature may be higher than a melting point of the connectors 150 and/or the joining connectors 610. In some embodiments, the sizes or dimensions of the conductive balls 620 are larger than the sizes or dimensions of the connectors 630, and the connectors 630 are larger than the contacts 142 and 122 in the package structure 10. Through these conductive connections, the semiconductor dies 120 of fine pitches are electrically connected with the semiconductor die 140 of a larger pitch and the circuit substrate 600 of further larger pitches.

After bonding the package structure 10 with the circuit substrate 600, the semiconductor die 140 is located in the cavity CV. As the cavity in the circuit substrate accommodates the die protruded from the package unit mounted to the circuit substrate, the total thickness of the whole package structure may be reduced. As seen in FIG. 12, the cavity CV has a size larger than that of the semiconductor die 140, and the semiconductor die 140 is spaced apart form the sidewalls and bottom of the cavity CV with a space therebetween. In some embodiments, the back surface 140S of the semiconductor die 140 is distanced from the bottom of the cavity CV with a distance Dt ranging from about 1 micron to about 100 microns. For example, the distance Dt is smaller than the depth Dcv of the cavity and a ratio of Dt/Dcv ranges from about 0.1 to about 0.5. Although it is shown in FIG. 15, one semiconductor die 140 is located within the cavity CV, it is understood that more than one dies may be accommodated in the cavity CV. In some embodiments, when the package units as depicted in FIG. 8 and FIG. 9 are mounted to the circuit substrate, the circuit substrate may include a single cavity to accommodate two or four dies in the same cavity or multiple cavities to accommodate one or more dies therein in a one-to-one fashion.

Figure 13:
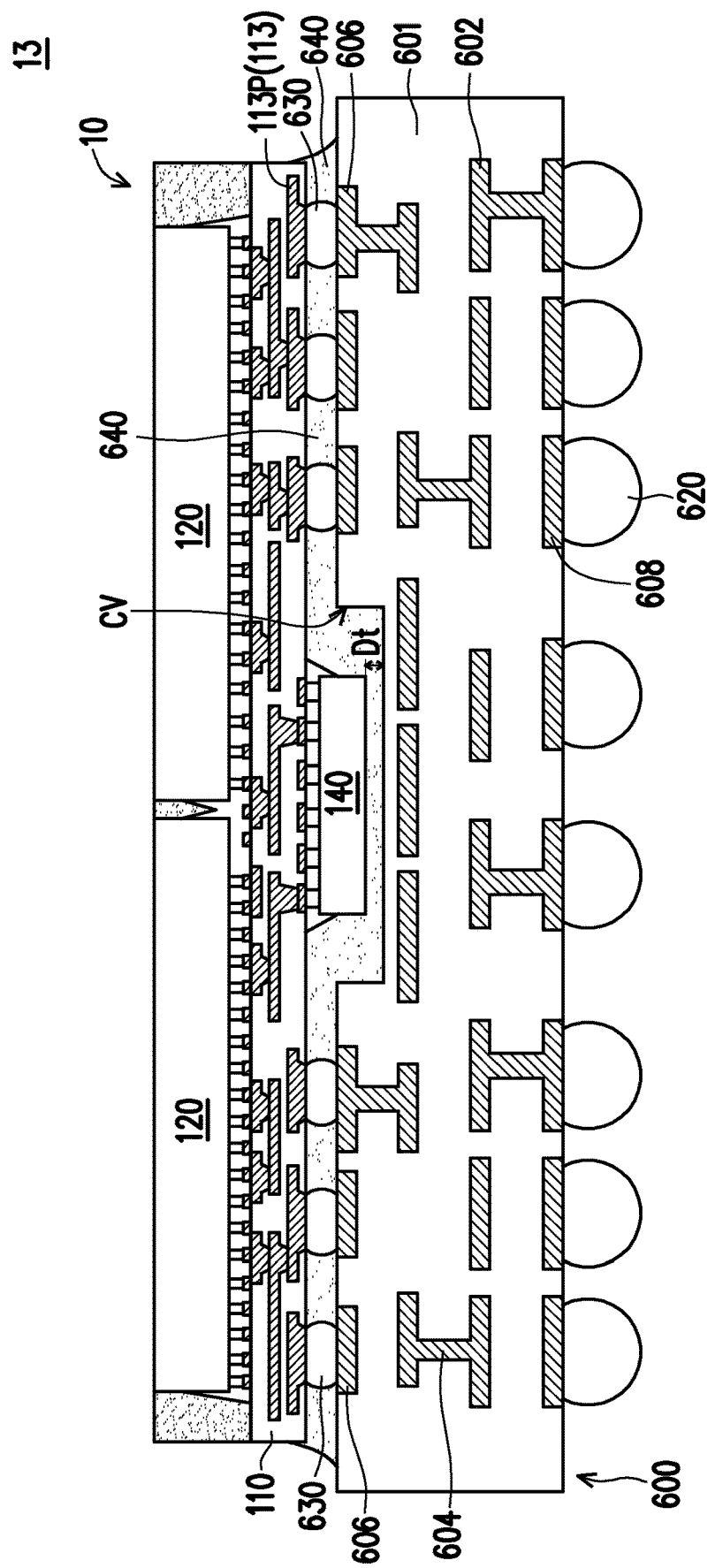
Figure 13A:
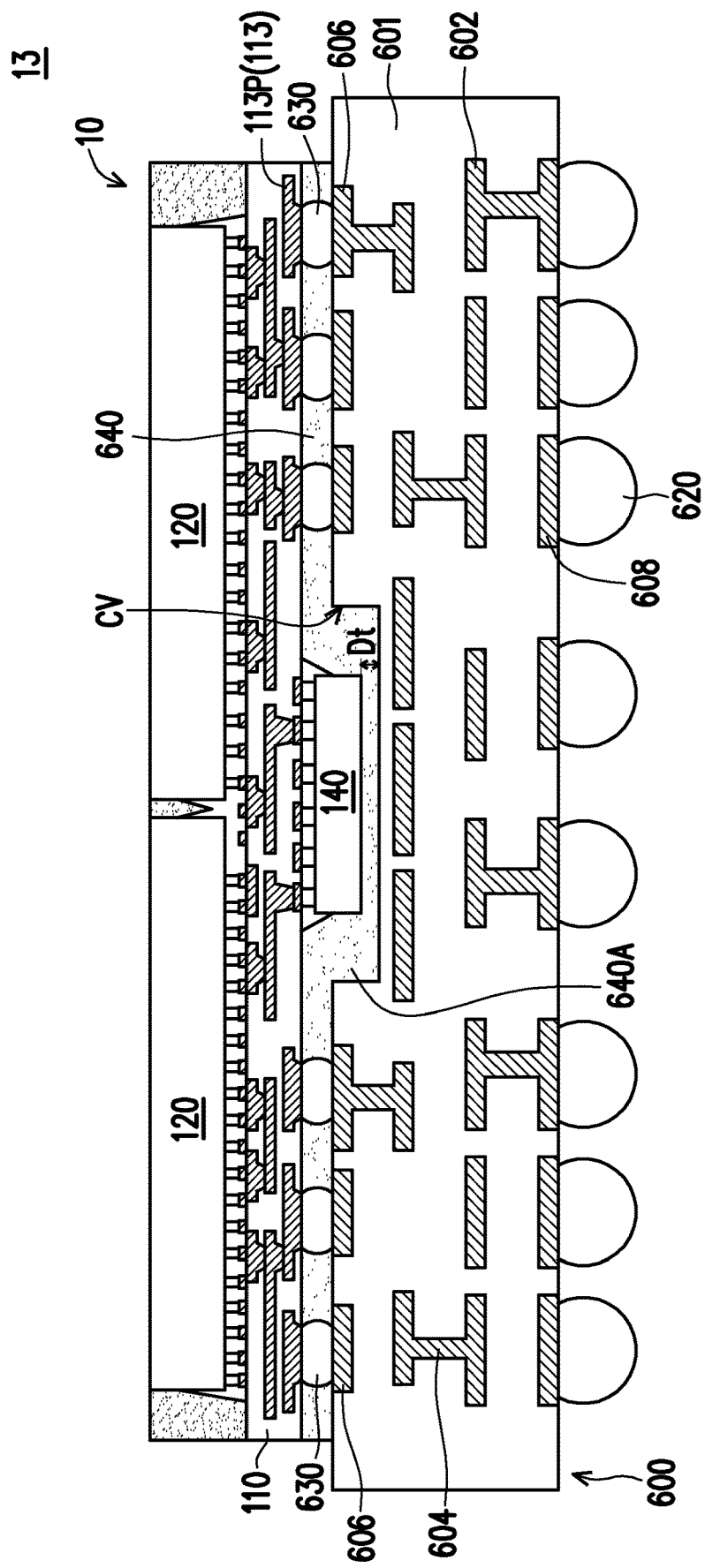
FIG. 13A is a schematic cross-sectional view illustrating the semiconductor package connected to the circuit substrate according to some embodiments of the present disclosure.

In FIG. 13, in some embodiments, an underfill 640 is formed and filled between the package structure 10 and the circuit substrate 600 to form a semiconductor device package structure 13. In some embodiments, the underfill 640 is filled between the semiconductor die 140 and the cavity CV and filled between the fused connectors 630 that are located between the package unit 10 and the circuit substrate 600. In some embodiments, the underfill 640 is formed as a void-free filling material filling up the cavity CV and between the package unit 10 and the circuit substrate 600. The underfill 640 can protect the fused connectors 630 against thermal or physical stresses and further secure the semiconductor die 140 located in the cavity CV of the circuit substrate 600. Since no metallization patterns or traces are exposed from the sidewalls and bottom of the cavity CV, better adhesion between the underfill 640 and the surfaces of the cavity CV is achieved, and the reliability of the whole device structure is enhanced.

In some embodiments, in FIG. 13, the underfill 640 is formed by capillary underfill filling (CUF) and the underfill 640 not only fills up the gaps between the package structure 10 and the circuit substrate 600 but also overflows to partially cover the sidewalls of the redistribution layer 110. In some embodiments, as shown in FIG. 13A, the underfill 640A is formed by transfer molding, and the sidewalls of the underfill 640A are coplanar with and vertically aligned with the sidewalls of the redistribution layer 110. In some embodiments, a curing process may be performed to consolidate the underfill 640. In some embodiments, as no metallization patterns or traces are exposed from the sidewalls and bottom of the cavity CV, the later filled underfill 640 has good adhesion with the surfaces of the cavity CV, such as the dielectric surface(s) of the dielectric material 601, and the robustness and reliability of the package device structure become better.

The disclosure is not limited neither by the type nor the number of semiconductor packages 10 connected to the circuit substrate 600. In the drawings of the present disclosure, an integrated fan-out (InFO) package is shown as the semiconductor package unit for purpose of illustration. However, it will be apparent that other types of semiconductor packages may be used to produce semiconductor device package structures including the circuit substrate disclosed herein, and all these semiconductor devices are intended to fall within the scope of the present description and of the attached claims. For example, Chip-On-Wafer-On-Substrate (CoWoS) structures, three-dimensional integrated circuit (3DIC) structures, Chip-on-Wafer (CoW) packages, Package-on-Package (PoP) structures may all be used as the semiconductor package units, alone or in combination.

From the exemplary schematic view of FIG. 14A, the semiconductor die 140 is electrically connected with the two semiconductor dies 120 through the contacts 122, 142 and vertically stacking metallization patterns VM of the redistribution layer 110. In some embodiments, the semiconductor die 140 functions as the bridging component for electrically connecting the two semiconductor dies 120 through the vertically stacking metallization patterns VM, which leads to a shorter electrical path and better electrical performance. In some embodiments, the vertically stacking metallization patterns VM include vertically aligned vias stacked upon one another and metal patterns sandwiched between the stacked vias.

In some other embodiments, referring to FIG. 14B, the semiconductor die 140A further includes through semiconductor vias (TSV) 140V penetrating through the semiconductor die 140A, and the semiconductor die 140A located within the cavity CV is electrically connected to a metallization pattern 602 below the cavity CV of the circuit substrate 600 though bumps Bp. That is, the semiconductor die 140A of the package structure is electrically connected with the metallization pattern 602 of the circuit substrate 600. Referring to FIG. 14B, the semiconductor die 140A may function as a bridging component for the other dies of the package unit and electrically connect the above package unit and the below circuit substrate as part of the electrical connection path, which further shortens the electrical conduction path and improves the performance of the whole structure. Using the structure depicted in FIG. 15B as an example, the connecting scheme described in FIG. 14B may be applicable for the semiconductor die accommodated in the cavity CV2.

According to some embodiments, a semiconductor package includes at least a circuit substrate, a semiconductor die and a filling material. The circuit substrate has a first surface, a second surface opposite to the first surface and a cavity concave from the first surface. The circuit substrate includes a dielectric material and a metal floor plate embedded in the dielectric material and located below the cavity. A location of the metal floor plate corresponds to a location of the cavity. The metal floor plate is electrically floating and isolated by the dielectric material. The semiconductor die is disposed in the cavity and electrically connected with the circuit substrate. The filling material is disposed between the semiconductor die and the circuit substrate. The filling material fills the cavity and encapsulates the semiconductor die to attach the semiconductor die and the circuit substrate.

According to some embodiments, a package includes at least a redistribution layer having a first surface and a second surface opposite to the first surface, a molded structure disposed on the first surface of the redistribution layer, and a circuit substrate. The molded structure includes a first die and a second die laterally surrounded by a molding compound, and the first and second dies are electrically connected with the redistribution layer. The circuit substrate is connected with the second surface of the redistribution layer. The circuit substrate includes a dielectric material, a cavity concave into the dielectric material and having metal-free dielectric surfaces, and a floor plate embedded in the dielectric material and located below the cavity. A third die is disposed on the second surface of the redistribution layer and electrically connected with the redistribution layer. The third die is located in the cavity, and the underfill is disposed between the third die and the cavity and between the circuit substrate and the redistribution layer.

According to some embodiments, a manufacturing method is provided. A redistribution layer is formed. First semiconductor dies are bonded onto a first surface of the redistribution layer. The semiconductor dies are molded with a molding compound. A second semiconductor die is bonded onto a second surface of the redistribution layer opposite to the first surface. A circuit substrate having a dielectric material and a floor plate embedded in the dielectric material is provided. A cavity is formed in the circuit substrate by removing a portion of the dielectric layer without exposing the floor plate. The circuit substrate is connected with the redistribution layer and the second semiconductor die is accommodated in the cavity. An underfill is dispensed into the cavity to fill up the cavity and surround the second semiconductor die and fill between the circuit substrate and the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a circuit substrate having a first surface, a second surface opposite to the first surface and a cavity concave from the first surface, wherein the circuit substrate includes a dielectric material and a metal floor plate embedded in the dielectric material and located below the cavity, wherein the metal floor plate includes a plurality of metal plates, a location of the metal floor plate corresponds to a location of the cavity, both top and bottom surfaces of the metal floor plate are fully covered by the dielectric material, and the metal floor plate is electrically floating and isolated by the dielectric material;
a semiconductor die, disposed in the cavity and electrically connected with the circuit substrate; and
a filling material, disposed between the semiconductor die and the circuit substrate, wherein the filling material fills the cavity and encapsulates the semiconductor die to attach the semiconductor die and the circuit substrate.

2. The semiconductor package as claimed in claim 1, further comprising a redistribution layer disposed on and connected to an active surface of the semiconductor die and connected to the first surface of the circuit substrate.

3. The semiconductor package as claimed in claim 2, wherein the semiconductor die is electrically connected with the circuit substrate via the redistribution layer.

4. The semiconductor package as claimed in claim 2, further comprising a molded structure disposed on the redistribution layer, wherein the molded structure includes another semiconductor die electrically connected with the redistribution layer and the semiconductor die and electrically connected with the circuit substrate.

5. The semiconductor package as claimed in claim 4, wherein the redistribution layer includes vertically stacking metallization patterns, and the semiconductor die is electrically connected with the another semiconductor die through the vertically stacking metallization patterns.

6. The semiconductor package as claimed in claim 1, wherein the semiconductor die includes through semiconductor vias (TSVs) penetrating through the semiconductor die and the semiconductor die is electrically connected with the circuit substrate via the TSVs.

7. The semiconductor package as claimed in claim 1, wherein a bottom of the cavity is spaced apart from the metal floor plate with a distance with the dielectric material sandwiched therebetween.

8. The semiconductor package as claimed in claim 1, wherein a vertical projection of the cavity falls within a span of the metal floor plate.

9. The semiconductor package as claimed in claim 1, wherein a vertical projection of the cavity overlaps the metal floor plate.

10. A package comprising:
a redistribution layer having a first surface and a second surface opposite to the first surface;
a molded structure disposed on the first surface of the redistribution layer, wherein the molded structure includes a first die and a second die laterally surrounded by a molding compound, and the first and second dies are electrically connected with the redistribution layer;
a circuit substrate connected with the second surface of the redistribution layer, wherein the circuit substrate includes a dielectric material, a cavity concave into the dielectric material and having metal-free dielectric surfaces, and a floor plate embedded in the dielectric material with both top and bottom surfaces of the floor plate being fully covered by the dielectric material and located below the cavity, wherein the floor plate includes a single metallic plate with a mesh pattern, and a vertical projection of the cavity overlaps the single metallic plate;
a third die, disposed on the second surface of the redistribution layer, located in the cavity and electrically connected with the redistribution layer; and
an underfill, disposed between the third die and the cavity and between the circuit substrate and the redistribution layer.

11. The package as claimed in claim 10, wherein the dielectric material sandwiched between the floor plate and a bottom of the cavity has a thickness ranging from about 1 micron to about 100 microns.

12. The package as claimed in claim 10, wherein a vertical projection of the cavity falls within a span of the floor plate, and the span of the floor plate is larger than a span of the cavity.

13. The package as claimed in claim 10, wherein a back surface of the third die is distanced from a bottom of the cavity with a distance ranging from about 1 micron to about 100 microns.

14. The package as claimed in claim 10, wherein the third die is encapsulated by the underfill and the third die is electrically connected with the circuit substrate via the redistribution layer.

15. The package as claimed in claim 10, wherein the third die includes through semiconductor vias (TSVs) penetrating through the third die and the third die is electrically connected with the circuit substrate via the TSVs.

16. A package comprising:
a redistribution layer having a first surface and a second surface opposite to the first surface;
a molded structure disposed on the first surface of the redistribution layer, wherein the molded structure includes a first die and a second die laterally surrounded by a molding compound, and the first and second dies are electrically connected with the redistribution layer;
a circuit substrate connected with the second surface of the redistribution layer, wherein the circuit substrate includes a dielectric material, a cavity concave into the dielectric material and having metal-free dielectric surfaces, and a floor plate embedded in the dielectric material with both top and bottom surfaces of the floor plate being fully covered by the dielectric material and located below the cavity, wherein the floor plate includes multiple parallel arranged metallic plates, and a vertical projection of the cavity overlaps the multiple parallel arranged metallic plates;
a third die, disposed on the second surface of the redistribution layer, located in the cavity and electrically connected with the redistribution layer; and
an underfill, disposed between the third die and the cavity and between the circuit substrate and the redistribution layer.

17. The package as claimed in claim 16, wherein the dielectric material sandwiched between the floor plate and a bottom of the cavity has a thickness ranging from about 1 micron to about 100 microns.

18. The package as claimed in claim 16, wherein a back surface of the third die is distanced from a bottom of the cavity with a distance ranging from about 1 micron to about 100 microns.

19. The package as claimed in claim 16, wherein the third die is encapsulated by the underfill and the third die is electrically connected with the circuit substrate via the redistribution layer.

20. The package as claimed in claim 16, wherein the third die includes through semiconductor vias (TSVs) penetrating through the third die and the third die is electrically connected with the circuit substrate via the TSVs.

* * * * *